(12) United States Patent
Hwang et al.

(10) Patent No.: US 9,612,378 B2
(45) Date of Patent: Apr. 4, 2017

(54) FOLDER TYPE POLARIZING FILM FOR ORGANIC LIGHT EMITTING DIODE

(75) Inventors: Seon Oh Hwang, Uiwang-si (KR); Yong Woon Kim, Uiwang-si (KR); Hae Ryong Chung, Uiwang-si (KR)

(73) Assignee: Cheil Industries, Inc., Gumi-Si, Kyeongsangbuk-do (KR)

(*) Notice: Subject to any disclaimer, the term of this patent is extended or adjusted under 35 U.S.C. 154(b) by 1425 days.

(21) Appl. No.: 13/339,469

(22) Filed: Dec. 29, 2011

(65) Prior Publication Data

US 2012/0170245 A1 Jul. 5, 2012

(30) Foreign Application Priority Data

Dec. 31, 2010 (KR) .................. 10-2010-0140289
Dec. 5, 2011 (KR) .................. 10-2011-0128775
Dec. 27, 2011 (KR) .................. 10-2011-0143779

(51) Int. Cl.
  *G02B 5/30* (2006.01)
  *G02B 27/28* (2006.01)
  *H01L 51/52* (2006.01)

(52) U.S. Cl.
CPC .......... *G02B 5/305* (2013.01); *H01L 51/5281* (2013.01); *H01L 2251/5338* (2013.01)

(58) Field of Classification Search
CPC .... G02B 5/3083; G02B 1/105; G02B 5/3025; G02B 5/3033; G02B 6/0053; G02B 6/105; G02B 6/0028; G02B 6/0073; G02B 27/286; G02B 5/208; G02B 5/3041; G02B 5/3058; G02B 5/32; G02B 6/0051; G02B 6/0055; G02B 6/0085; G02B 27/281

USPC ...... 353/20; 359/485.01, 15, 34; 349/62, 96; 385/11, 133; 362/19, 610, 615

See application file for complete search history.

(56) References Cited

U.S. PATENT DOCUMENTS

| | | | |
|---|---|---|---|
| 2006/0055848 A1* | 3/2006 | Kim et al. | 349/107 |
| 2006/0268200 A1* | 11/2006 | Ohgaru et al. | 349/97 |
| 2007/0008459 A1* | 1/2007 | Park et al. | 349/96 |
| 2007/0286969 A1* | 12/2007 | Nagpal | C08G 18/3237 428/1.31 |
| 2008/0318034 A1* | 12/2008 | Murakami et al. | 428/336 |

(Continued)

FOREIGN PATENT DOCUMENTS

| | | |
|---|---|---|
| KR | 10-2007-0007418 A | 1/2007 |
| KR | 10-2010-0101981 A | 9/2010 |

OTHER PUBLICATIONS

Yamazaki, Industrialization and application development of cyclo-olefin polymer, Masahiro Yamazaki, ZEON Corporation, 2-6-1 Marunouchi, Chiyoda-ku, Tokyo 100-8323, Japan, Journal of Molecular Catalysis A: Chemical 213 (2004) 81-87.*

(Continued)

*Primary Examiner* — Scott J Sugarman
*Assistant Examiner* — Sharrief Broome
(74) *Attorney, Agent, or Firm* — Lee & Morse, P.C.

(57) ABSTRACT

A folder type polarizing film for OLEDs and a display device, the film including a polarizer; a transparent support attached to an upper surface of the polarizer, the transparent support being a cycloolefin polymer film; and a compensation film attached to a lower surface of the polarizer, the compensation film being a cycloolefin polymer having a phase difference of $\lambda/4$ relative to a polarization axis of the polarizer.

8 Claims, 2 Drawing Sheets

(56) References Cited

U.S. PATENT DOCUMENTS

2009/0033833 A1* 2/2009 Aminaka ............... C09J 133/06
                                                       349/68
2009/0279170 A1* 11/2009 Miyazaki et al. ............ 359/488
2010/0272971 A1* 10/2010 Miyai ..................... C08L 23/18
                                                      428/212

OTHER PUBLICATIONS

Office Action mailed Mar. 31, 2014 in corresponding Korean Patent Application No. 10-2011-0143779.

* cited by examiner

FOLDER TYPE POLARIZING FILM FOR ORGANIC LIGHT EMITTING DIODE

BACKGROUND

1. Field

Embodiments relate to a folder type polarizing film for an organic light emitting diode (OLED).

2. Description of the Related Art

A polarizing film may be provided to either side of a liquid crystal cell to control an oscillating direction of light in order to visualize a display pattern of a liquid crystal display. The polarizing film may include a polarizer prepared by stretching, dyeing, and color-correcting a polyvinyl alcohol film, a protective film stacked on at least one side of the polarizer to protect the polarizer, and a compensation film stacked on the other side of the polarizer.

SUMMARY

Embodiments are directed to a folder type polarizing film for an organic light emitting diode (OLED).

The embodiments may be realized by providing a folder type polarizing film for OLEDs, the film including a polarizer; a transparent support attached to an upper surface of the polarizer, the transparent support being a cycloolefin polymer film; and a compensation film attached to a lower surface of the polarizer, the compensation film being a cycloolefin polymer having a phase difference of $\lambda/4$ relative to a polarization axis of the polarizer.

The polarizing film may have a tensile strength of about 13 to about 20 kgf/mm$^2$.

The cycloolefin polymer film of the transparent support may have a tensile strength of about 5.5 to about 6.5 kgf/mm$^2$.

The cycloolefin polymer film of the compensation film may have a tensile strength of about 6.5 to about 7.5 kgf/mm$^2$.

The film may further include an adhesive layer between the transparent support and the polarizer; and an adhesive layer between the polarizer and the compensation film.

The film may further include a pressure sensitive adhesive layer on a lower surface of the compensation film.

The embodiments may also be realized by providing an electronic device including an OLED display; and the film according to an embodiment attached to a surface of the OLED display.

BRIEF DESCRIPTION OF THE DRAWINGS

The embodiments will become apparent to those of ordinary skill in the art by describing in detail exemplary embodiments with reference to the attached drawings in which.

DETAILED DESCRIPTION

Figure 1:
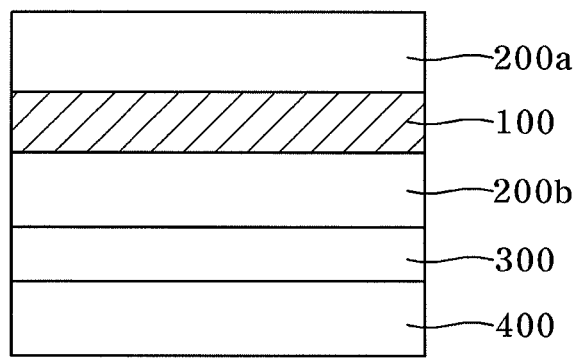
FIG. 1 illustrates a sectional view of a polarizing film in which a polycarbonate film is used as a compensation film.

Korean Patent Applications Nos. 10-2010-0140289, filed on Dec. 31, 2010, 10-2011-0128775, filed on Dec. 5, 2011, 10-2011-0143779, filed on Dec. 27, 2011, in the Korean Intellectual Property Office, and entitled: "Folder Type Polarizing Film for Organic Light Emitting Diode," are incorporated by reference herein in their entireties.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
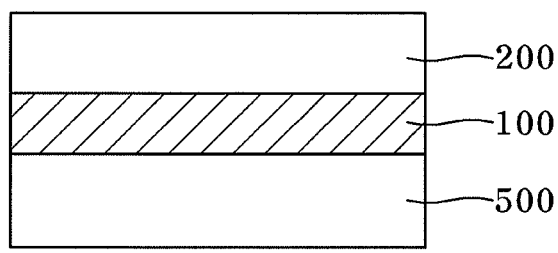
FIG. 2 illustrates a sectional view of a side view of polarizing film including a cycloolefin polymer film.

FIG. 1 illustrates a sectional view of a polarizing film in which a polycarbonate film is used as a compensation film. The polarizing film may include upper and lower transparent supports 200a, 200b attached to opposite sides of a polarizer 100 via adhesives (not shown), and a polycarbonate film 400 (attached to the lower transparent support via an adhesive layer 300) acting as a compensation film. FIG. 2 illustrates a sectional view of a polarizing film including a cycloolefin polymer film. In the polarizing film of FIG. 2, a triacetyl cellulose film 200 may be attached to one side of a polarizer 100 to act as a transparent support, and a cycloolefin polymer film 500 may be attached to another side of the polarizer 100.

According to an embodiment, a folder type polarizing film for OLEDs may include a polarizer; a transparent support (attached to an upper surface of the polarizer); and a compensation film (attached to a lower surface of the polarizer). The transparent support may be or include a cycloolefin polymer film, and the compensation film may be or include a cycloolefin polymer film having a phase difference of $\lambda/4$ relative to a polarization axis of the polarizer.

Figure 3:
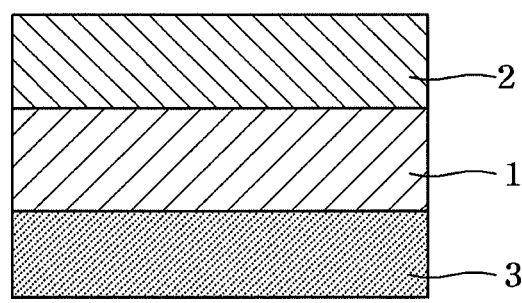
FIG. 3 illustrates a sectional view of a polarizing film in accordance with an embodiment.

FIG. 3 illustrates a sectional view of a polarizing film in accordance with an embodiment. Referring to FIG. 3, the polarizing film according to the present embodiment may include a polarizer 1, a transparent support 2 (attached to an upper surface of the polarizer 1), and a compensation film 3 (attached to a lower surface of the polarizer 1). Herein, spatially relative terms 'upper (surface)' and 'lower (surface)' are used for ease of description to describe a relationship between elements or features as illustrated in the drawings, and are not used only to denote upper and lower surfaces.

In the present embodiment, the polarizing film may have a folding function when folded to have a radius of curvature of about 5 mm or less, e.g., about 3 to about 5 mm. As used herein, the term 'folding function' means that a folded portion of the polarizing film is not whitened even after being folded to a radius of radius of curvature 5 mm or less about 1,000 times or more, e.g., about 1,000 to about 50,000 times or about 10,000 to about 50,000 times. Such a folding function of the polarizing film may facilitate operation of the OLED when the polarizing film is applied to the OLED.

The polarizing film according to the present embodiment may have a tensile strength of about 13 to about 20 kgf/mm$^2$, e.g., about 13 to about 15 kgf/mm$^2$. Tensile strength is the maximum stress that a material may withstand before breaking due to tensile load. Although it is possible to provide a folding function to the polarizing film by increasing tensile strength thereof, it is important for the polarizing film to have good optical characteristics for application to OLEDs. The polarizing film according to the present embodiment may have a tensile strength in the range of about 13 to about 20 kgf/mm$^2$. Thus, it may be possible to provide a folding function while maintaining good optical characteristics. The tensile strength may be measured using, e.g., a typical stress-strain curve.

In the polarizing film according to the present embodiment, the transparent support may be or may include a cycloolefin polymer film. The cycloolefin polymer film may have a tensile strength of about 5.5 to about 6.5 kgf/mm$^2$, e.g., about 5.5 to about 6.4 kgf/mm$^2$ or about 6.0 to about 6.4 kgf/mm$^2$. Within this range, the polarizing film may have a folding function. The cycloolefin polymer film (of the transparent support) may have Ro of about 0 to about 1 nm and Rth of about 0 to about 5 nm at a wavelength of 550 nm.

In the polarizing film according to the present embodiment, the compensation film may be or may include a cycloolefin polymer film having an optical axis that forms an angle of 45 or 135 degrees with respect to a polarization axis of the polarizer to have a phase difference of λ/4 relative to the polarization axis of the polarizer. When such a λ/4 phase difference film is also used as the transparent support, it may not be applied to the OLED. The cycloolefin polymer film may have a tensile strength of about 6.5 to about 7.5 kgf/mm$^2$, e.g., about 6.6 to about 7.5 kgf/mm$^2$ or about 6.6 to about 7.0 kgf/mm$^2$. Within this range, the polarizing film may have a folding function. The cycloolefin polymer film (of the compensation film) may have Ro of about 138 to about 142 nm and Rth of about 154 to about 158 nm at a wavelength of 550 nm.

In another implementation, the polarizing film according to the present embodiment may be attached to a liquid crystal cell.

According to the present embodiment, the transparent support may be made of or may include the cycloolefin polymer film having a phase difference of 0 and the compensation film may be made of or may include the cycloolefin polymer film having a phase difference of λ/4, so that the polarizing film may be applied to OLEDs having a folding function while maintaining optical characteristics of the polarizing film (such as transmittance, polarization degree, cross transmittance, and the like).

Next, the components of the polarizing film will be described in more detail.

The polarizer may include any suitable polyvinyl alcohol film. For example, the polarizer may include a modified polyvinyl alcohol film (such as a partially formylized polyvinyl alcohol film, acetoacetyl-modified polyvinyl alcohol film, and the like).

The polyvinyl alcohol film may have a degree of polymerization of about 2,400 to about 4,000. Within this range, the polyvinyl alcohol film may be used as a polarizer and may maintain optical characteristics when applied to a polarizing film.

The polarizer may be prepared by dyeing a polyvinyl alcohol film with iodine or dichroic dyes, and stretching the dyed film in a certain direction. For example, the polarizer may be manufactured through swelling, dyeing, stretching, and crosslinking operations. The polarizer may have a thickness of, e.g., about 20 μm to about 30 μm.

The transparent support may be a film that supports and protects the polarizer. The transparent support may be optically transparent, may not cause double refraction, and may have high heat resistance and mechanical strength so as to provide physical support and protection to the polarizer. Further, the transparent support may be easily bonded to bonding agents or adhesives. The transparent support may have a thickness of, e.g., about 10 μm to about 40 μm.

An adhesive layer (not shown in FIG. 3) may be formed between the polarizer and the transparent support to bond the polarizer to the transparent support. Adhesives used for formation of the bonding layer may include, e.g., a polyvinyl alcohol-based polymer. Here, the polyvinyl alcohol-based polymer may be used together with a water-soluble crosslinking agent, e.g., boric acid, borax, glutaraldehyde, melamine, and/or oxalic acid, which may be used alone or in combination of two or more thereof.

Another adhesive layer (not shown in FIG. 3) may be formed between the polarizer and the compensation film to bond the polarizer to the compensation film. Adhesives used for formation of this bonding layer may include, e.g., a (meth)acrylic polymer.

The compensation film may have the same or different thickness from that of the transparent support. The compensation film may have a thickness of, e.g., about 10 μm to about 40 μm.

Figure 4:
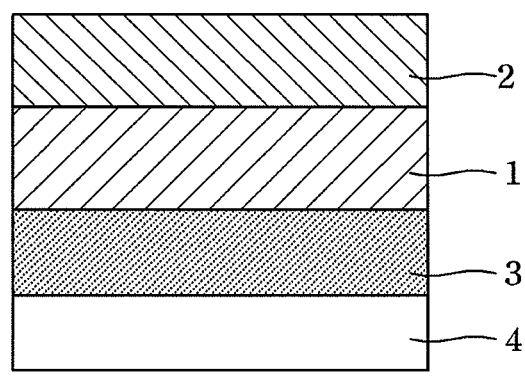
FIG. 4 illustrates a sectional view of a polarizing film in accordance with another embodiment.

The polarizing film according to an embodiment may further include a pressure sensitive adhesive layer on a lower surface of the compensation film. FIG. 4 illustrates a sectional view of a polarizing film in accordance with another embodiment. Referring to FIG. 4, the polarizing film may include a pressure sensitive adhesive layer 4 attached to a lower surface of the compensation film 3. The pressure sensitive adhesive layer may include any suitable adhesive, e.g., (meth)acrylic adhesives, silicone adhesives, polyester adhesives, polyurethane adhesives, polyether adhesives, rubber adhesives, and the like. To prevent peeling or separation caused by moisture absorption, deterioration of chemical characteristics, or bending of liquid crystal cells caused by differences in coefficients of thermal expansion, the adhesives may have a low moisture absorption rate and high heat resistance. For example, the pressure sensitive adhesive layer may be formed by forming a stripping coat using a stripping agent, such as (meth)acrylic, silicone, acryl silicone, polyester, heat resistant rubber, long chain alkyl, fluorene, and molybdenum sulfide stripping agents.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

A description of details apparent to those skilled in the art may be omitted herein.

Example 1

Preparation of Polarizing Film

A 60 μm thick polyvinyl alcohol film was dipped into an aqueous iodine solution at 40° C. to be stretched 5 times, and was dried at 80° C. for 10 minutes, thereby providing a polarizer. On respective upper and lower surfaces of the polarizer, a 22 μm thick cycloolefin polymer film (e G-film, at a wavelength of 550 nm, Ro=1 nm, Rth=5 nm, tensile strength: 6.4 kgf/mm$^2$, Nippon Zeon Co. Ltd.) and a 33 μm thick cycloolefin polymer film having a phase difference of λ/4 (ZD12-141158-A1340, at a wavelength of 550 nm, Ro=140 nm, Rth=156 nm, Nz=1.6, tensile strength: 6.9 kgf/mm², Zeon Co. Ltd.) were bonded via a polyvinyl alcohol adhesive Z-320 (Nippon Gohsei Co., Ltd.), thereby providing a polarizing film. The polarizing film had a tensile strength of 13.2 kgf/mm². The tensile strength of the polarizing film was measured using a texture analyzer TA.XTplus (Stable Micro Systems Co., Ltd.).

Comparative Example 1

Preparation of Polarizing Film

The polarizing film according to Comparative Example 1 was obtained by the same method as in Example 1 except for that a triacetylcellulose film (tensile strength: 11.7 kgf/mm²) was attached to the upper surface of the polarizer. The polarizing film had a tensile strength of 8.9 kgf/mm².

Comparative Example 2

Preparation of Polarizing Film

The polarizing film according to Comparative Example 1 was obtained by the same method as in Example 1 except that a triacetylcellulose film (phase difference: λ/4, tensile strength: 6.9 kgf/mm²) was attached to the lower surface of the polarizer. The polarizing film had a tensile strength of 11.0 kgf/mm².

Experiment: Measurement of Physical Properties of Polarizing Film

1. Evaluation of Folding Function

The polarizing films prepared in Example 1 and Comparative Examples 1 and 2 were bent to a radius of curvature of 5 mm by the number of times as listed in Table 1. Then, the folding function of the polarizing films was evaluated by ○ or × through confirmation as to whether an OLED including a corresponding polarizing film was operated, and without deformation of the polarizing film. When a certain polarizing film was not deformed and the OLED including this polarizing film was operated, this polarizing film was evaluated as ○. When a certain polarizing film was deformed and the OLED including this polarizing film was not operated, this polarizing film was evaluated as x. Results are shown in Table 1.

TABLE 1

| Number of Folded times | Example 1 | Comparative Example 1 | Comparative Example 2 |
|---|---|---|---|
| 1,000 times | ○ | ○ | ○ |
| 10,000 times | ○ | x | x |
| 15,000 times | ○ | x | x |
| 50,000 times | ○ | x | x |

As may be seen from Table 1, the polarizing film according to Example 1 did not deform, and the OLED including the same was operated (even after being bent 10,000 times or more to a curvature of radius of 5 mm). On the contrary, the polarizing films according to Comparative Examples 1 and 2 were deformed when bent 10,000 times.

2 Evaluation of Optical Characteristics

Each of the polarizing films according to Example 1 and the Comparative Examples was attached to a holder of an optical characteristics tester V-7100 (Jasco Co., Ltd.), and fitted into a sample stage. Testing was conducted in consideration of a direction of light upon practical use of the polarizing film. After closing the sample stage, a program was set corresponding to the optical axis. Transmittance, cross-transmittance, and polarization degree were obtained from data provided by the program. Results are shown in Table 2.

TABLE 2

|  | Example 1 | Comparative Example 1 | Comparative Example 2 |
|---|---|---|---|
| Transmittance (%) | 41.53 | 42.59 | 42.82 |
| Cross-transmittance (%) | 0.0009 | 0.0011 | 0.0019 |
| Degree of polarization (%) | 99.9970 | 99.997 | 99.9948 |

As may be seen from Table 2, the polarizing film according to Example 1 maintained optical characteristics, e.g., transmittance, polarization degree, and the like.

By way of summation and review, a folder type display may be advantageous in terms of portability and large screen. Folder type displays may be used in a wide range of applications including mobile devices, such as mobile phones, PMPs, navigators, electronic books, and electronic newspapers, and other fields such as TVs, monitors, and the like. For operation of such a folder type display, it may be important for the polarizing film to have a folding function. With increasing trend towards portability, it is anticipated that demand for folder type displays will increase. Therefore, a folder type polarizing film for OLEDs, which has a folding function while maintaining optical characteristics, is desirable.

The embodiments provide a folder type polarizing film for OLEDs, which includes a transparent support made of a cycloolefin polymer (COP) film and a compensation film made of a cycloolefin polymer film having a phase difference of λ/4 relative to a polarization axis of a polarizer to provide a folding function while maintaining optical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A folder type polarizing film for OLEDs, the film comprising:
 a polarizer;
 a transparent support attached to an upper surface of the polarizer, the transparent support being a cycloolefin polymer film; and
 a compensation film attached to a lower surface of the polarizer, the compensation film being a cycloolefin polymer having a phase difference of λ/4 relative to a polarization axis of the polarizer,
 wherein:
 the polarizing film as a whole has a tensile strength of about 13 to about 20 kgf/mm², and a folded portion of the polarizing film is not whitened after being folded to a radius of curvature of 5 mm about 1,000 or more times.

2. The film as claimed in claim 1, wherein the cycloolefin polymer film of the transparent support has a tensile strength of about 5.5 to about 6.5 kgf/mm$^2$.

3. The film as claimed in claim 1, wherein the cycloolefin polymer film of the compensation film has a tensile strength of about 6.5 to about 7.5 kgf/mm$^2$.

4. The film as claimed in claim 1, further comprising:
   an adhesive layer between the transparent support and the polarizer; and
   an adhesive layer between the polarizer and the compensation film.

5. The film as claimed in claim 1, further comprising a pressure sensitive adhesive layer on a lower surface of the compensation film.

6. An electronic device, comprising:
   an OLED display; and
   the film as claimed in claim 1 attached to a surface of the OLED display.

7. The film as claimed in claim 1, wherein the cycloolefin polymer film of the transparent support has a phase difference of 0.

8. The film as claimed in claim 1, wherein:
   the cycloolefin polymer film of the transparent support has a tensile strength of about 5.5 to about 6.5 kgf/mm$^2$,
   the cycloolefin polymer film of the compensation film has a tensile strength of about 6.5 to about 7.5 kgf/mm$^2$, and
   the cycloolefin polymer film of the transparent support has a phase difference of 0.

* * * * *